(12) United States Patent
Lin et al.

(10) Patent No.: US 9,525,101 B2
(45) Date of Patent: Dec. 20, 2016

(54) OPTOELECTRONIC DEVICE

(71) Applicant: EPISTAR CORPORATION, Hsinchu (TW)

(72) Inventors: Shiuan-Leh Lin, Hsinchu (TW); Shih-Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/257,716

(22) Filed: Apr. 21, 2014

(65) Prior Publication Data

US 2014/0312370 A1   Oct. 23, 2014

(30) Foreign Application Priority Data

Apr. 23, 2013   (TW) .............................. 102114540 A (51) Int. Cl.
| | | |
|---|---|---|
| H01L 29/66 | (2006.01) | |
| H01L 29/778 | (2006.01) | |
| H01L 21/02 | (2006.01) | |
| H01L 21/30 | (2006.01) | |
| H01L 29/205 | (2006.01) | |
| H01L 31/18 | (2006.01) | |
| H01L 33/12 | (2010.01) | |
| H01L 31/0304 | (2006.01) | |
| H01L 31/0687 | (2012.01) | |

(52) U.S. Cl.
CPC ........... *H01L 33/12* (2013.01); *H01L 21/0251* (2013.01); *H01L 21/02461* (2013.01); *H01L 21/02505* (2013.01); *H01L 21/02543* (2013.01); *H01L 31/03046* (2013.01); *H01L 31/06875* (2013.01); *H01L 31/1844* (2013.01); *Y02E 10/544* (2013.01)

(58) Field of Classification Search
CPC ........... H01L 31/06875; H01L 31/1844; H01L 29/788; H01L 29/20
USPC .... 257/194, 615, E29.246, E29.089; 438/94; 136/255
See application file for complete search history.

(56) References Cited

U.S. PATENT DOCUMENTS

| | | | |
|---|---|---|---|
| 2010/0089442 A1* | 4/2010 | Beasley ............ | H01L 31/02021 136/255 |
| 2010/0229926 A1* | 9/2010 | Newman et al. ............. | 136/255 |
| 2011/0220190 A1* | 9/2011 | Lee et al. ...................... | 136/255 |
| 2012/0223365 A1* | 9/2012 | Briere ........................... | 257/194 |
| 2013/0270628 A1* | 10/2013 | Huang et al. ................. | 257/329 |
| 2014/0305498 A1* | 10/2014 | Liu et al. ...................... | 136/255 |

* cited by examiner

*Primary Examiner* — Kimberly Rizkallah
*Assistant Examiner* — Brian Turner
(74) *Attorney, Agent, or Firm* — Patterson + Sheridan, LLP (57) ABSTRACT

An optoelectronic device comprising a first semiconductor layer having a first lattice constant; a second semiconductor layer having a second lattice constant, wherein the second lattice constant is smaller than the first lattice constant; and a first buffer layer formed between the first semiconductor layer and the second semiconductor layer, wherein a lattice constant of one side of the first buffer layer near the second semiconductor layer is smaller than the second lattice constant.

10 Claims, 7 Drawing Sheets

OPTOELECTRONIC DEVICE

CROSS-REFERENCE TO RELATED APPLICATION

The invention claims priority from Taiwan Application Ser. No. TW/102114540, filed Apr. 23, 2013, which is incorporated by reference in its entirety.

TECHNICAL FIELD

The application relates to an optoelectronic device, and more particularly, to an optoelectronic device having a buffer layer with a gradient lattice constant.

DESCRIPTION OF BACKGROUND ART

Figure 1:
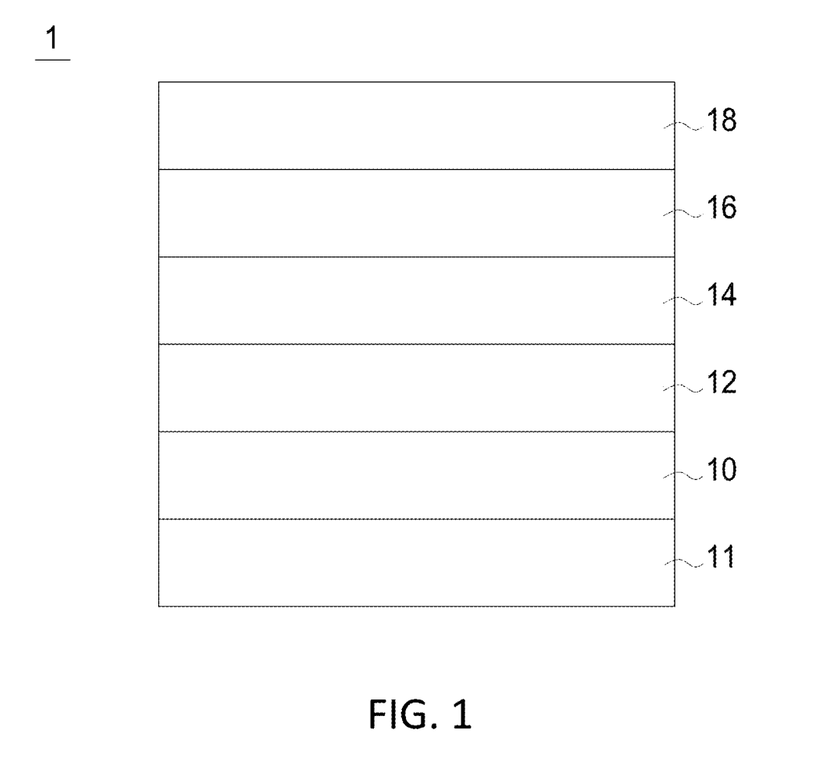
FIG. 1 illustrates a conventional optoelectronic device.
Figure 2:
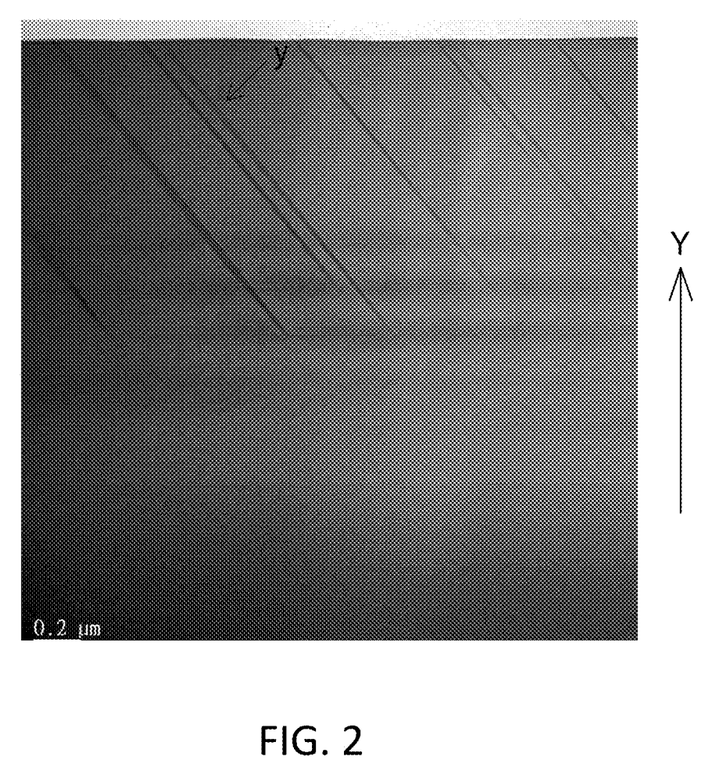
FIG. 2 illustrates an SEM diagram of a cross-sectional view of the conventional optoelectronic device.

FIG. 1 illustrates a structure cross-sectional view of a conventional optoelectronic device 1. As shown in FIG. 1, the optoelectronic device 1 comprises a substrate 11 and a plurality of semiconductor layers 10, 12, 14, 16, 18 formed on the substrate 11, wherein the plurality of semiconductor layers 10, 12, 14, 16, 18 is sequentially grown on the substrate 11, and lattice constants of the semiconductor layers 10, 12, 14, 16, 18 gradually decrease along a thickness direction from the semiconductor layer 10 to the semiconductor layer 18. When a semiconductor layer having a smaller lattice constant, such as the semiconductor layer 12, is grown on a semiconductor layer having a larger lattice constant, such as the semiconductor layer 10, a tensile stress is formed between the semiconductor layer 10 and the semiconductor layer 12, and the tensile stress is not easily released. After the semiconductor layer 10 and the semiconductor layer 12 are formed, when the semiconductor layers 14, 16, 18 are grown on the semiconductor layer 12, the tensile stress is continually accumulated in the optoelectronic device 1, then defects or dislocations are formed. FIG. 2 illustrates an SEM diagram of a cross-sectional view of the conventional optoelectronic device 1. When the plurality of semiconductor layers 10, 12, 14, 16, 18 is sequentially grown on the substrate 11, the tensile stress induces large amount of defects or dislocations, and the defects or dislocations, as marked by y in FIG. 2, are continually accumulated along a thickness direction of the semiconductor layer as marked by a direction of an arrow Y in FIG. 2

SUMMARY OF THE APPLICATION

An optoelectronic device comprising a first semiconductor layer having a first lattice constant; a second semiconductor layer having a second lattice constant, wherein the second lattice constant is smaller than the first lattice constant; and a first buffer layer formed between the first semiconductor layer and the second semiconductor layer, wherein a lattice constant of one side of the first buffer layer near the second semiconductor layer is smaller than the second lattice constant.

DETAILED DESCRIPTION OF PREFERRED EMBODIMENTS

The embodiment of the application is illustrated in detail, and is plotted in the drawings. The same or the similar part is illustrated in the drawings and the specification with the same number.

Figure 3:
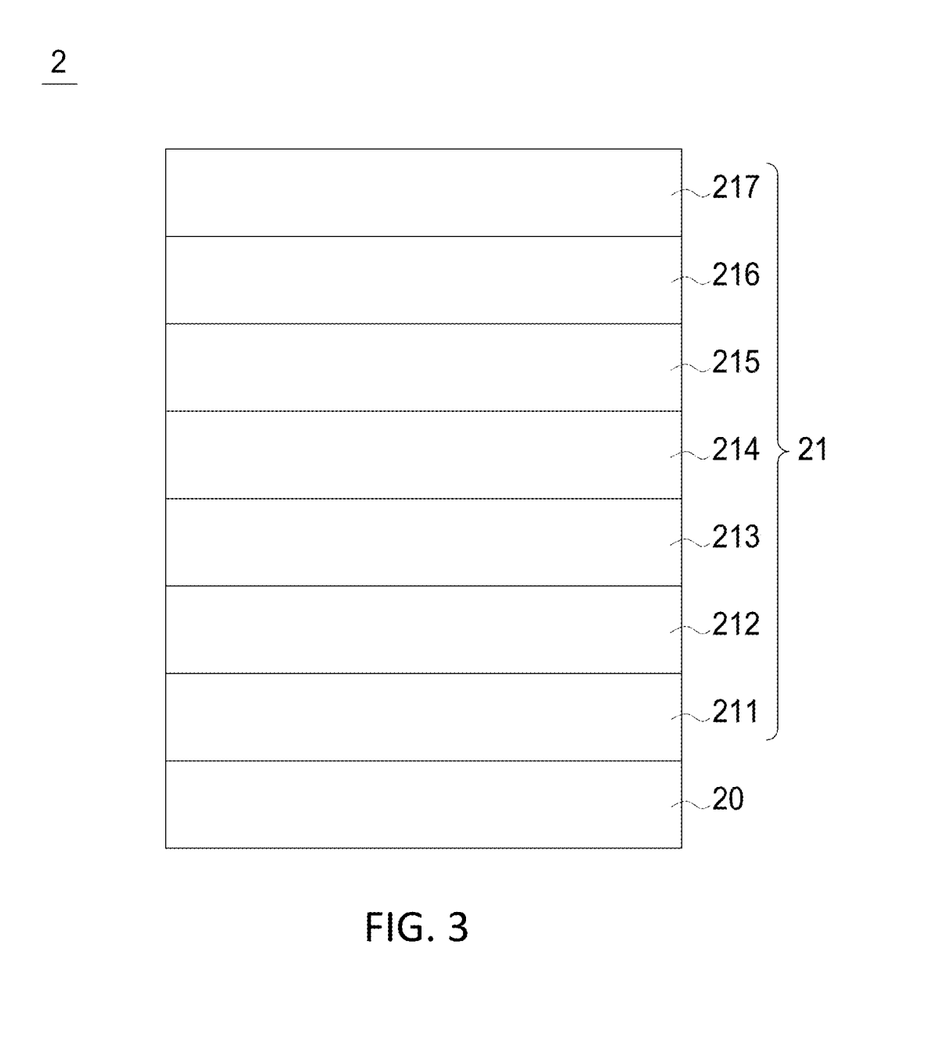
FIG. 3 illustrates an optoelectronic device in accordance with an embodiment of the present application.

FIG. 3 illustrates a structure cross-sectional view of an optoelectronic device 2 in accordance with an embodiment of the present application. As shown in FIG. 3, the optoelectronic device 2 comprises a substrate 20 and a semiconductor stack 21 formed on the substrate 20, wherein the semiconductor stack 21 comprises a light-emitting diode epitaxial stack and/or a solar cell epitaxial stack, wherein the substrate 20 can be used to support and/or grow the semiconductor stack 21. The semiconductor stack 21 comprises a plurality of semiconductor layers. Specifically, the semiconductor stack 21 comprises a first semiconductor layer 211 having a first lattice constant; a second semiconductor layer 213 having a second lattice constant; a third semiconductor layer 215 having a third lattice constant; and a fourth semiconductor layer 217 having a fourth lattice constant. The example shown above is only for illustration, not intended to limit the amount of the semiconductor layers of the semiconductor stack 21.

The semiconductor stack 21 comprises a buffer layer formed between adjacent two semiconductor layers. Specifically, the semiconductor stack 21 comprises a first buffer layer 212 formed between the first semiconductor layer 211 and the second semiconductor layer 213; a second buffer layer 214 formed between the second semiconductor layer 213 and the third semiconductor layer 215; and a third buffer layer 216 formed between the third semiconductor layer 215 and the fourth semiconductor layer 217. Each of the buffer layers comprises a lattice constant. Specifically, the first buffer layer 212 comprises a first buffer layer lattice constant, the second buffer layer 214 comprises a second buffer layer lattice constant, the third buffer layer 216 comprises a third buffer layer lattice constant.

The material of the semiconductor stack 21 comprises group III-V semiconductor materials, for example, the material of the semiconductor stack 21 comprises one or more elements selected from arsenic (As), gallium (Ga), aluminum (Al), indium (In), phosphorus (P), and nitrogen (N). The method of forming the semiconductor stack 21 is not particularly limited, may be a known epitaxy method, such as metallic-organic chemical vapor deposition (MOCVD) method, a molecular beam epitaxy (MBE) method, a hydride vapor phase epitaxy (HVPE) method, evaporation, or plating.

The substrate 20 of the optoelectronic device 2 is formed on a side near the first semiconductor layer 211. The material of the substrate 20 comprises inorganic material or group III-V semiconductor material. The inorganic material comprises silicon carbide (SiC), sapphire, lithium aluminate (LiAlO$_2$), zinc oxide (ZnO), glass or quartz. The III-V group semiconductor material comprises indium phosphide (InP), gallium phosphide (GaP), gallium nitride (GaN), aluminum nitride (AlN) or germanium (Ge).

The lattice constant is related with the atomic size of the element. The larger the atomic size is, the larger the lattice constant is. On the contrary, the smaller the atomic size is, the smaller the lattice constant is. During the epitaxial growth process of the semiconductor stack 21, the lattice constants of the first semiconductor layer 211, the second semiconductor layer 213, the third semiconductor layer 215 and the fourth semiconductor layer 217 can be changed by adjusting element concentration, such as indium concentration, of group III-V semiconductor material of the first semiconductor layer 211, the second semiconductor layer 213, the third semiconductor layer 215 and the fourth semiconductor layer 217, but not limit to indium, other group III A element, such as aluminum, or groupV A element, such as phosphorus or arsenic, can also be used to change the lattice constants of the semiconductor layers. In an embodiment of the application, the material of the semiconductor stack 21 comprises In$_x$Ga$_{1-x}$P, and the lattice constant of each semiconductor layer can be changed by adjusting the indium concentration of each semiconductor layer. Indium has a larger atomic size than that of gallium, and the lattice constant of In$_x$Ga$_{1-x}$P can be increased by increasing the ratio of indium. Specifically, the higher the indium concentration is, the larger the lattice constant is. On the contrary, the lower the indium concentration is, the smaller the lattice constant is. In another embodiment of the application, the material of the semiconductor stack 21 comprises GaAs$_y$P$_{1-y}$, and the lattice constant of each semiconductor layer can be changed by adjusting the arsenic concentration of each semiconductor layer. Arsenic has a larger atomic size than that of phosphorus, and the lattice constant of GaAs$_y$P$_{1-y}$ can be increased by increasing the ratio of arsenic. The higher the arsenic concentration is, the larger the lattice constant is. On the contrary, the lower the arsenic concentration is, the smaller the lattice constant is. Accordingly, the lattice constant of each semiconductor layer can be changed by adjusting the phosphorus concentration of each semiconductor layer. Phosphorus has a smaller atomic size than that of arsenic, and the lattice constant of GaAs$_y$P$_{1-y}$ can be decreased by increasing the ratio of phosphorus. The higher the phosphorus concentration is, the smaller the lattice constant is. On the contrary, the lower the phosphorus concentration is, the larger the lattice constant is.

Figure 4:
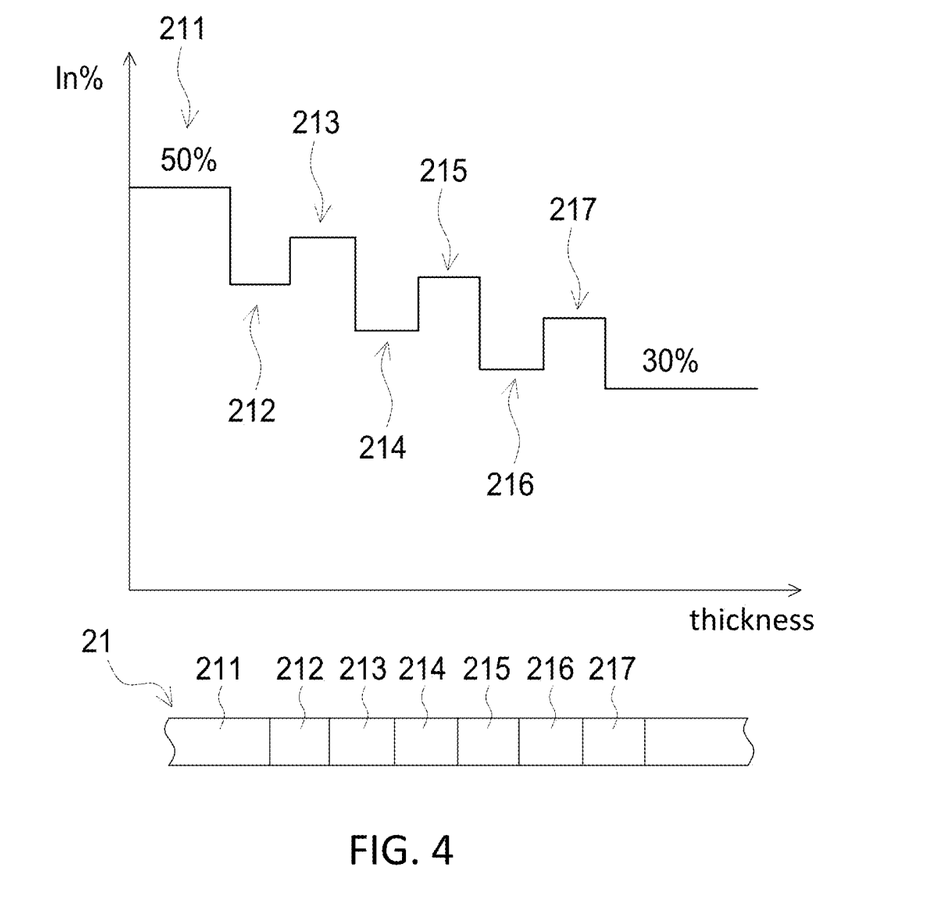
FIG. 4 illustrates an indium concentration distribution along a thickness direction in accordance with a first embodiment of the present application.
Figure 5:
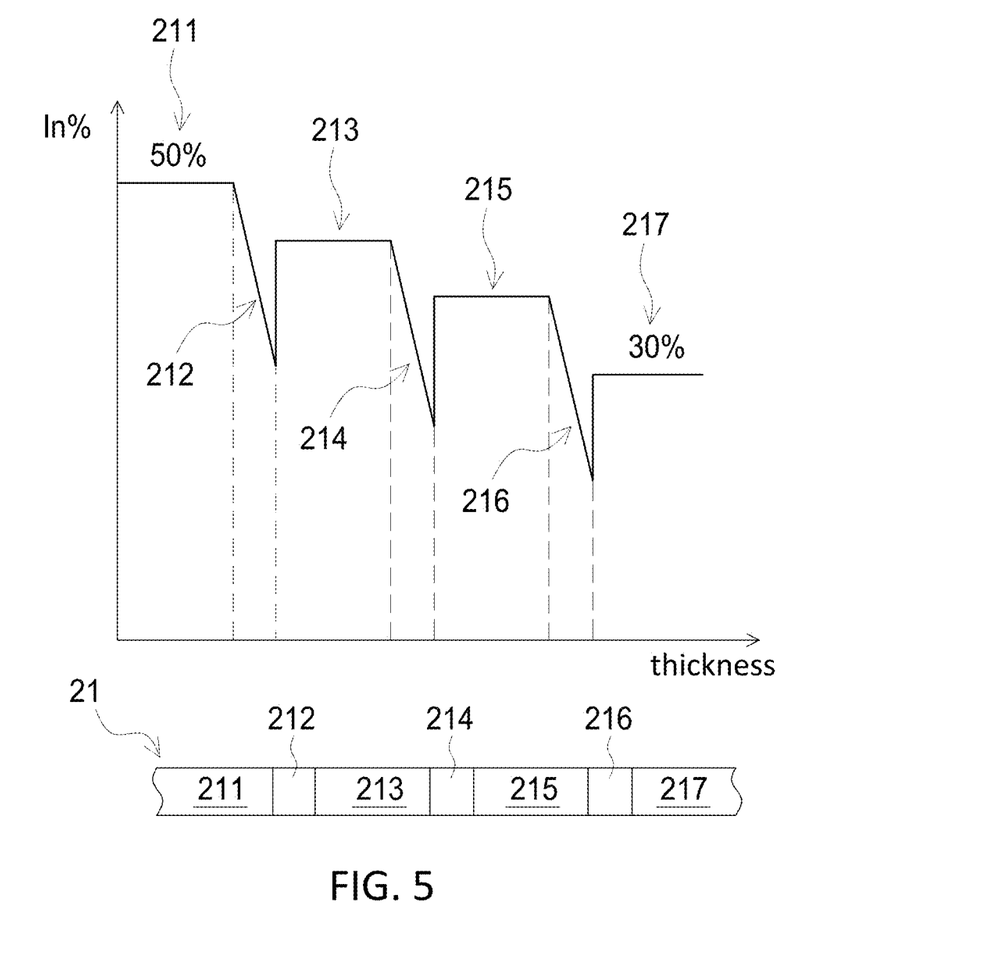
FIG. 5 illustrates an indium concentration distribution along a thickness direction in accordance with a second embodiment of the present application.
Figure 6:
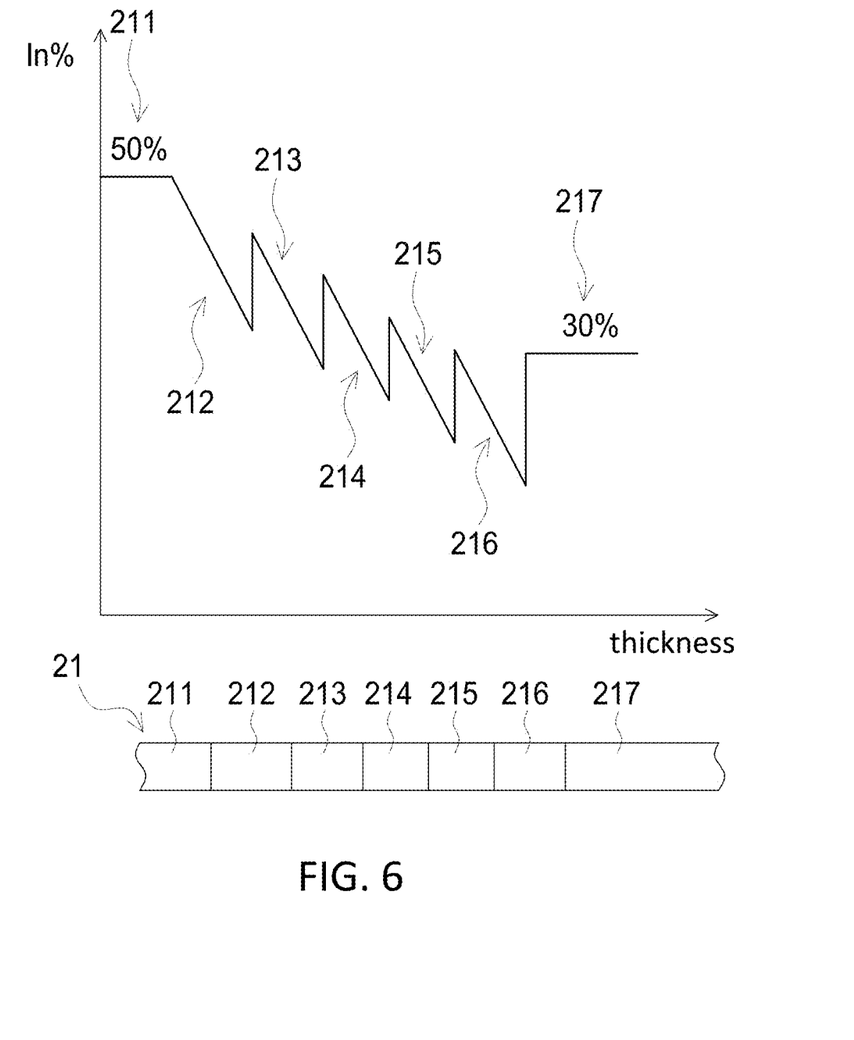
FIG. 6 illustrates an indium concentration distribution along a thickness direction in accordance with a third embodiment of the present application.

FIGS. 4-6 illustrate the application with the semiconductor stack 21 comprising In$_x$Ga$_{1-x}$P, but this is only for illustration and not intended to limit the scope of the application. Other group III-V semiconductor materials can also be used in the application.

FIG. 4 illustrates an indium concentration distribution of the semiconductor stack 21 of an optoelectronic device 2 along a thickness direction in accordance with a first embodiment of the present application. The first semiconductor layer 211 comprises a first indium concentration, the second semiconductor layer 213 comprises a second indium concentration, the third semiconductor layer 215 comprises a third indium concentration, and a fourth semiconductor layer 217 comprises a fourth indium concentration. A relationship between the indium concentration of each semiconductor layer and the lattice constant of each semiconductor layer is a positive correlation. The material of the first semiconductor layer 211 can be In$_{0.5}$Ga$_{0.5}$P, and the first indium concentration is approximately 50%. The indium concentrations of the semiconductor layers gradually decrease along a thickness direction from the first semiconductor layer 211 to the fourth semiconductor layer 217. The material of the semiconductor layer on a side near the fourth semiconductor layer 217 can be In$_{0.3}$Ga$_{0.7}$P, and the indium concentration is approximately 30%. The indium concentrations of the semiconductor layers 211, 213, 215, 217 can be changed stepwise along a thickness direction from the first semiconductor layer 211 to the fourth semiconductor layer 217, as shown in FIG. 4, or can be changed continuously (not shown). The indium concentration of each semiconductor layer 211, 213, 215, 217 shown above is only for illustration and not intended to limit the scope of the application.

From the above description, when the indium concentrations of the semiconductor layers In$_x$Ga$_{1-x}$P gradually decrease, the lattice constants of the semiconductor layers also gradually decrease along a thickness direction from the first semiconductor layer 211 to the fourth semiconductor layer 217. Specifically, when the second indium concentration of the second semiconductor layer 213 is smaller than the first indium concentration of the first semiconductor layer 211, the second lattice constant of the second semiconductor layer 213 is smaller than the first lattice constant of the first semiconductor layer 211. For the same reason, when the third indium concentration of the third semiconductor layer 215 is smaller than the second indium concentration of the second semiconductor layer 213, the third lattice constant of the third semiconductor layer 215 is smaller than the second lattice constant of the second semiconductor layer 213; when the fourth indium concentration of the fourth semiconductor layer 217 is smaller than the third indium concentration of the third semiconductor layer 215, the fourth lattice constant of the fourth semiconductor layer 217 is smaller than the third lattice constant of the third semiconductor layer 215.

As shown in FIG. 4, a buffer layer is formed between adjacent two semiconductor layers. When the indium concentrations of the semiconductor layers In$_x$Ga$_{1-x}$P gradually decreases along a thickness direction from the first semiconductor layer 211 to the fourth semiconductor layer 217, the indium concentrations of the buffer layers In$_x$Ga$_{1-x}$P also gradually decrease along a thickness direction from the first semiconductor layer 211 to the fourth semiconductor layer 217. Specifically, the indium concentration of the buffer layer on a side near the first semiconductor layer 211, such as the indium concentration of the first buffer layer 212, is higher than the indium concentration of the buffer layer on a side near the fourth semiconductor layer 217, such as the indium concentration of the third buffer layer 216. The indium concentrations of the buffer layers can be gradually changed, such as be stepwise changed shown in FIG. 4, or be continuously changed (not shown). The indium concentrations of the buffer layers shown in FIG. 4 are only for illustration and not intended to limit the scope of the application.

As shown in FIG. 4, the indium concentration of the buffer layer between adjacent two semiconductor layers is lower than the indium concentrations of the adjacent two semiconductor layers. Taking the first buffer layer 212 as an example, the indium concentration of the first buffer layer 212 is lower than both the indium concentration of the first semiconductor layer 211 and the indium concentration of the second semiconductor layer 213.

The lattice constant of the buffer layer is positively correlated to the indium concentration. When the indium concentration of the buffer layer is decreased, the lattice constant of the buffer layer is decreased correspondingly. The lattice constants of the buffer layer 212, 214, 216 gradually change along a thickness direction from the first semiconductor layer 211 to the fourth semiconductor layer 217. The change can be stepwise change or continuously change, but the examples are only for illustration; not intended to limit the scope of the application. The lattice constant of the buffer layer between adjacent two semiconductor layers is smaller than the lattice constants of the adjacent two semiconductor layers. Taking the buffer layers 212, 214 as examples, the first buffer layer lattice constant of the first buffer layer 212 is smaller than the first lattice constant of the first semiconductor layer 211 and the second lattice constant of the second semiconductor layer 213. The second buffer layer lattice constant of the second buffer layer 214 is smaller than the second lattice constant of the second semiconductor layer 213 and the third lattice constant of the third semiconductor layer 215. The second buffer layer lattice constant of the second buffer layer 214 is smaller than the first buffer layer lattice constant of the first buffer layer 212.

FIG. 5 illustrates an indium concentration distribution of an optoelectronic device 2 along a thickness direction in accordance with a second embodiment of the present application. The same description between the present embodiment and the previous embodiment is not described again. The major difference between the present embodiment and the previous embodiment is the indium concentration of each buffer layer 212, 214, or 216 between the adjacent two semiconductor layers 211, 213, 215, or 217 changes gradually, and the lattice constant of each buffer layer corresponding gradually changes.

As shown in FIG. 5, the first buffer layer 212 is illustrated as an example, the indium concentration of the first buffer layer 212 gradually changes along a thickness direction from the first semiconductor layer 211 to the second semiconductor layer 213. The indium concentration of one side of the first buffer layer 212 which near the first semiconductor layer 211 is equal to or smaller than the first indium concentration of the first semiconductor layer 211. The indium concentration of another side of the first buffer layer 212 which near the second semiconductor layer 213 is smaller than the second indium concentration of the second semiconductor layer 213.

Because the indium concentration is positively correlated to the lattice constant, when the indium concentration of the buffer layer gradually changes, the lattice constant of the buffer layer changes correspondingly. Taking the first buffer layer 212 as an example, the first buffer layer lattice constant of the first buffer layer 212 changes continuously along a thickness direction from the first semiconductor layer 211 to the second semiconductor layer 213, but the example is only for illustration, and other profile of the change is also included. In another example, the first buffer layer lattice constant changes stepwise. Specifically, the buffer layer lattice constant of one side of the first buffer layer 212 which near the first semiconductor layer 211 is equal to or smaller than the first lattice constant of the first semiconductor layer 211. The lattice constant of another side of the first buffer layer 212 which near the second semiconductor layer 213 is smaller than the second lattice constant of the second semiconductor layer 213. In an embodiment, the lattice constant of the another side of the first buffer layer 212 which near the second semiconductor layer 213 differs from the second lattice constant of the second semiconductor layer 213 at least 0.3% or more.

FIG. 6 illustrates an indium concentration distribution of an optoelectronic device 2 along a thickness direction in accordance with a third embodiment of the present application. The same description between the present embodiment and the previous embodiment is not described again. As shown in FIG. 6, in addition to the indium concentration of each buffer layer 212, 214, 216 being changed gradually, the indium concentration of each semiconductor layer 213, 215 between the first buffer layer 212 and the third buffer layer 216 also changes gradually, wherein the gradual change can be a continuous change shown in FIG. 6, or a stepwise change (not shown).

As shown in FIG. 6, in addition to the outermost first semiconductor layer 211 and the outmost fourth semiconductor layer 217 of the semiconductor stack 21, interfaces between the buffer layers 212, 214, 216 and the semiconductor layers 213, 215 being formed between the buffer layers are respectively formed by adjoining a side having a lower indium concentration with a side having a higher indium concentration, then the concentrations of the buffer layers 212, 214, 216 and the semiconductor layers 213, 215 forms a zigzag profile. As a whole, the average indium concentrations of the buffer layer 212, 214, 216 gradually decrease along a thickness direction, the average indium concentrations of the semiconductor layers 213, 215 between the buffer layers also gradually decrease along a thickness direction. Specifically, the average indium concentration of the buffer layer 214 is lower than that of the buffer layer 212, and the average indium concentration of the buffer layer 216 is lower than that of the buffer layer 214. The average indium concentration of the semiconductor layer 215 is lower than that of the semiconductor layer 213.

Corresponding to the change of the indium concentration, interfaces between of the buffer layers 212, 214, 216 and the semiconductor layers 213, 215 being formed between the buffer layers are respectively formed by adjoining a side have a smaller lattice constant with a side having a larger lattice constant, then the lattice constants of the buffer layers 212, 214, 216 and the semiconductor layers 213, 215 form a zigzag profile, wherein the difference of the lattice constants of the two sides is at least 0.3% or above. As a whole, the average lattice constants of the buffer layers 212, 214, 216 gradually decrease along a thickness direction, and the average lattice constants of the semiconductor layers 213, 213 between the buffer layers also gradually decrease along a thickness direction.

Figure 7:
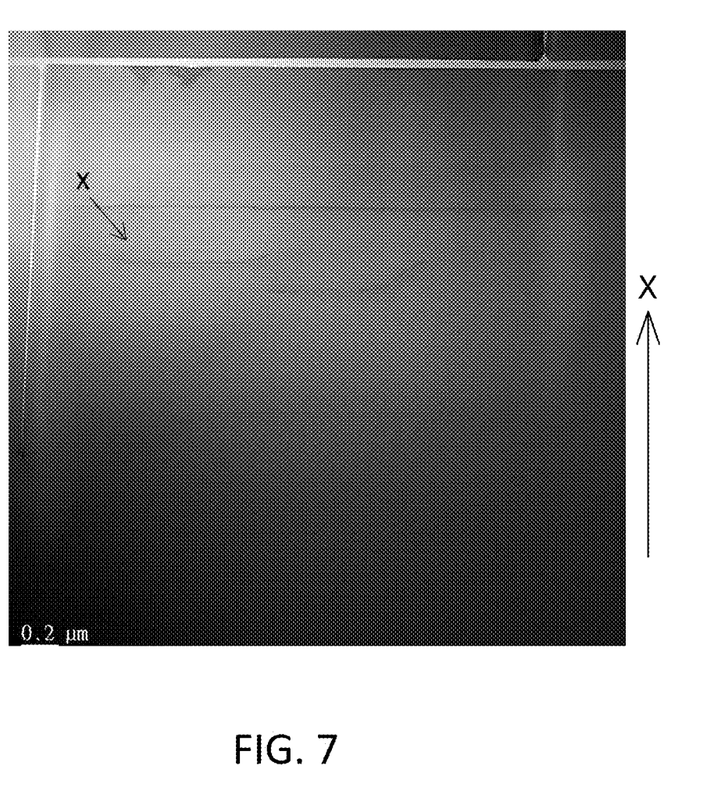
FIG. 7 illustrates an SEM diagram of a cross-sectional view of an optoelectronic device in accordance with an embodiment of the present application.

From the above description, when the first buffer layer lattice constant of the first buffer layer 212 is smaller than the first lattice constant of the first semiconductor layer 211 and the first buffer layer 212 is grown on the first semiconductor layer 211, a tensile stress is formed between the first semiconductor layer 211 and the first buffer layer 212. When the first buffer layer lattice constant of the first buffer layer 212 is smaller than the second lattice constant of the second semiconductor layer 213, and the second semiconductor layer 213 is grown on the first buffer layer 212, a compressive stress is formed between the second semiconductor layer 213 and the first buffer layer 212. The compressive stress between the second semiconductor layer 213 and the first buffer layer 212 eliminates the tensile stress between the first semiconductor layer 211 and the first buffer layer 212, then the stress between adjacent two semiconductor layers, such as the first semiconductor layer 211 and the second semiconductor layer 213, can be released, the defects or the dislocations of the optoelectronic device 2 are reduced. FIG. 7 illustrates an SEM diagram of a cross-sectional view of an optoelectronic device in accordance with an embodiment of the present application. The defects or the dislocations between adjacent semiconductor layers are restricted in a region, such as the region labeled by x shown in FIG. 7, and the defects or the dislocations do not extent outside along a thickness direction of the semiconductor stack, such as the direction labeled by an arrow X in FIG. 7.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. An optoelectronic device, comprising:
a first semiconductor layer having a first lattice constant;
a second semiconductor layer having a second lattice constant, wherein the second lattice constant is smaller than the first lattice constant; and
a first buffer layer formed between the first semiconductor layer and the second semiconductor layer, wherein a lattice constant of the first buffer layer immediately connected to the second semiconductor layer is smaller than the second lattice constant; wherein the lattice constant of the first buffer layer immediately connected to the second semiconductor layer differs from the second lattice constant of the second semiconductor layer at least 0.3% or more.

2. The optoelectronic device of claim 1, wherein a lattice constant of the first buffer layer near the first semiconductor layer is equal to or smaller than the first lattice constant.

3. The optoelectronic device of claim 2, wherein the first buffer layer comprises a lattice constant which gradually changes along a thickness direction from the first semiconductor layer to the second semiconductor layer.

4. The optoelectronic device of claim 3, wherein the lattice constant changes continuously or stepwise.

5. The optoelectronic device of claim 3, wherein the first buffer layer comprises an element having a concentration, and the concentration changes continuously or stepwise, and the element comprises group III A element or group VA element.

6. The optoelectronic device of claim 1, wherein the first semiconductor layer comprises a first element with a first concentration, the second semiconductor layer comprises the first element with a second concentration, and the first concentration is different from the second concentration, wherein the first element comprises group IIIA element or group VA element.

7. The optoelectronic device of claim 1, wherein a tensile stress is formed between the first semiconductor layer and the first buffer layer, and a compressive stress is formed between the second semiconductor layer and the first buffer layer.

8. The optoelectronic device of claim 1, further comprising a growth substrate formed on a side near the first semiconductor layer.

9. The optoelectronic device of claim 8, the growth substrate comprises sapphire.

10. The optoelectronic device of claim 1, further comprising a third semiconductor layer, and a second buffer layer formed between the second semiconductor layer and the third semiconductor layer, wherein interfaces between the first buffer layer, the second semiconductor layer, and the second buffer layer are respectively formed by adjoining a side having a smaller lattice constant with a side having a larger lattice constant.

* * * * *